US007718223B1

(12) United States Patent
Delzeit et al.

(10) Patent No.: US 7,718,223 B1
(45) Date of Patent: *May 18, 2010

(54) CONTROL OF CARBON NANOTUBE DENSITY AND TOWER HEIGHT IN AN ARRAY

(75) Inventors: Lance D. Delzeit, Sunnyvale, CA (US); John F. Schipper, Palo Alto, CA (US)

(73) Assignee: The United States of America as Represented by the Administrator of the National Aeronautics and Space Administration (NASA), Washington, DC (US)

( * ) Notice: Subject to any disclaimer, the term of this patent is extended or adjusted under 35 U.S.C. 154(b) by 1112 days.

This patent is subject to a terminal disclaimer.

(21) Appl. No.: 11/007,913

(22) Filed: Dec. 7, 2004

(51) Int. Cl.
*C23C 16/00* (2006.01)
(52) U.S. Cl. .................. 427/248.1; 427/585; 977/742
(58) Field of Classification Search .............. 427/248.1, 427/585; 977/742
See application file for complete search history.

(56) References Cited

U.S. PATENT DOCUMENTS

| 6,277,318 | B1 * | 8/2001 | Bower et al. ............ 264/346 |
| 6,331,209 | B1 * | 12/2001 | Jang et al. .................. 117/90 |
| 6,333,016 | B1 * | 12/2001 | Resasco et al. .......... 423/447.3 |
| 6,858,197 | B1 * | 2/2005 | Delzeit .................... 423/447.3 |
| 2003/0004058 | A1 | 1/2003 | Li et al. |
| 2004/0070326 | A1 | 4/2004 | Mao et al. |
| 2007/0032046 | A1 * | 2/2007 | Dmitriev et al. ........... 438/478 |
| 2008/0090183 | A1 * | 4/2008 | Zhu et al. .................. 430/324 |

OTHER PUBLICATIONS

Nonfinal Rejection, mailed Mar. 25, 2009, in related case U.S. Appl. No. 11/472,516, filed Jun. 20, 2006.
Response to Nonfinal Rejection, mailed Mar. 25, 2009, in related U.S. Appl. No. 11/472,516, Jun. 20, 2006, Response filed Sep. 24, 2009.

* cited by examiner

*Primary Examiner*—Shamim Ahmed
(74) *Attorney, Agent, or Firm*—John F. Schipper; Robert M. Padilla

(57) ABSTRACT

A method for controlling density or tower height of carbon nanotube (CNT) arrays grown in spaced apart first and second regions on a substrate. CNTs having a first density range (or first tower height range) are grown in the first region using a first source temperature range for growth. Subsequently or simultaneously, CNTs having a second density range (or second tower height range), having an average density (or average tower height) in the second region different from the average density (or average tower height) for the first region, are grown in the second region, using supplemental localized heating for the second region. Applications for thermal dissipation and/or dissipation of electrical charge or voltage in an electronic device are discussed.

20 Claims, 11 Drawing Sheets

CONTROL OF CARBON NANOTUBE DENSITY AND TOWER HEIGHT IN AN ARRAY

ORIGIN OF THE INVENTION

This invention was made by employees of the U.S. government. The U.S. government has the right to make, use and/or sell the invention described herein without payment of compensation therefor, including but not limited to payment of royalties.

FIELD OF THE INVENTION

This invention relates to control of varying density and varying tower height of arrays of carbon nanotubes grown on a substrate.

BACKGROUND OF THE INVENTION

In 1991, S. Iijima (Nature, vol. 354: 56-58) reported growth of multi-wall coaxial nanotubes, containing 2-50 layers with radial separations of about 0.34 nm, using an arc discharge evaporation method similar to that used for Fullerene synthesis. The nanotubes originally observed by Iijima were formed on the negative voltage end of a carbon electrode and were plentiful in some regions and sparse in other regions. Since that time, other workers have developed other discharge means for controlled deposition of graphitic carbon. However, it is not straightforward to control the growth of or density of, single wall nanotubes ("SWCNTs"), multi-wall nanotubes ("MWCNTs") and/or carbon-based nanofibers ("CNFs").

Recently, interest has grown in use of arrays of carbon nanotubes ("CNTs") as an intermediary for transport of electrical particles (e.g., electrons) and/or transport of thermal energy from one body to another. For example, a CNT array may be used for dissipation of thermal energy or accumulated electrical charge associated with operation of an electronics device or system. However, the device or system connected to the CNT array(s) may require use of different CNT array densities and/or different CNT tower heights in different regions, because of differing transport requirements. Use of a mask to discriminate between a CNT growth region and a no-growth region has been demonstrated. However, this approach only produces different regions where CNTs are present (with a substantially constant density) and where CNTs are absent (density substantially 0).

What is needed is a method and system for controlling density and/or tower height of CNTs grown on a substrate, where the CNT density and/or the CNT average tower height are allowed to vary from one location to another. Preferably, the approach should allow imposition of tight or loose local variations of density and/or tower height, depending upon the relative tightness of growth through local temperature control. Preferably, the approach should allow variation, by a factor of 1-10, in the local CNT density, and a factor of 100-300, in the local CNT average tower height.

SUMMARY OF THE INVENTION

These needs are met by the invention, which provides for control of local density and/or control of local tower height of a CNT array by variation of the local CNT growth temperature within calculable limits. A first region may have a first range of CNT densities and/or a first range of CNT tower heights; and an adjacent second region, spaced apart from the first region, may have a second range of densities and/or a second range of tower heights that partly overlaps, or has no overlap with, the first density range and/or the first tower height range. The second range has a higher CNT density and/or higher CNT tower height and uses supplemental heating to provide the higher CNT density and/or higher CNT tower height, based on an experimentally determined growth curve and experimental configuration of a device (CNT density versus temperature and/or CNT tower height versus temperature). This approach should be distinguished from masking of regions on a substrate, where the result is binary: either a CNT array with a fixed density and substantially constant tower height appears, or no CNTs appear in the region.

DESCRIPTION OF BEST MODES OF THE INVENTION

Figure 1:
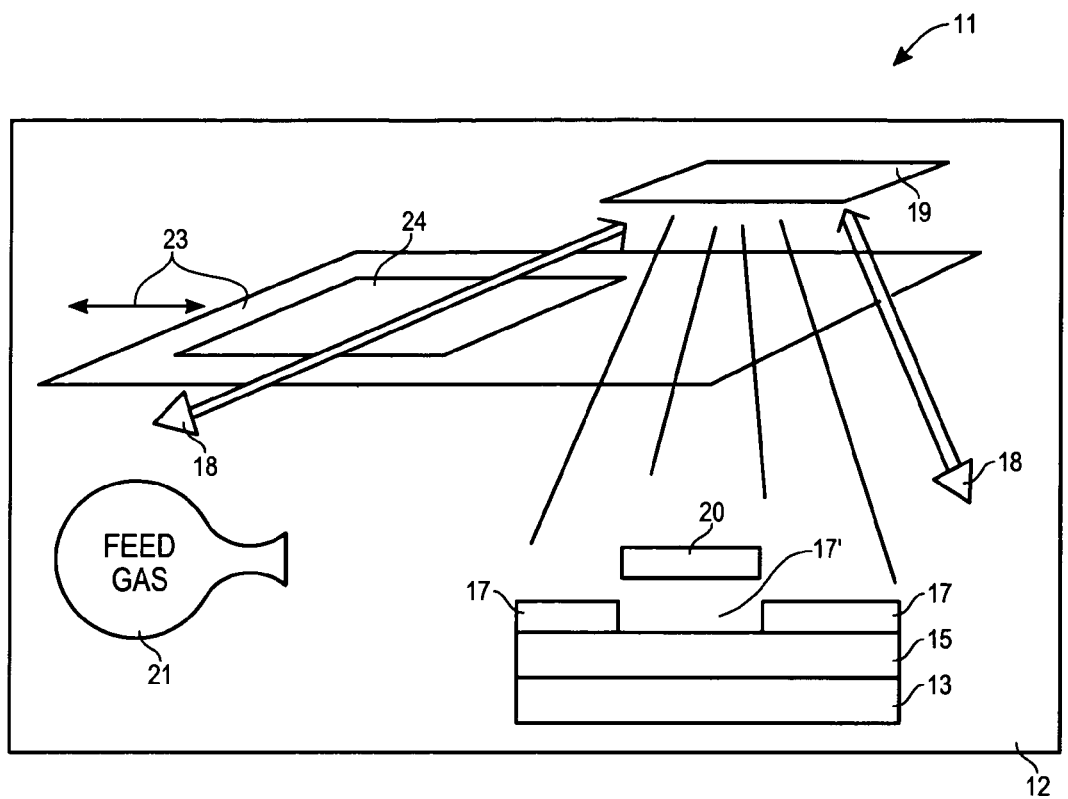
FIG. 1 illustrates a system for generating and controlling the growth of an SWCNT or an MWCNT, depending upon the choice of several parameters.

FIG. 1 illustrates a system 11 for generating and controlling patterned growth of an array of CNTs. A substrate 13 located in a chamber 12 is coated with a first layer 15 (optional) of a selected first metal, preferably Al and/or Ir, having a thickness of at least 1-10 nm (for Al) or 5-20 nm (for Ir). A thicker first layer can be used but does not produce any significant changes in the array thus produced. Optionally, the first layer 15 has a multi-layer structure, including a first sub-layer 15A of a metal or alloy, such as Pt, Pd, Cr, Mo, Ti and/or W, that has selected electrical conductivity properties, and a second sub-layer 15B, preferably Al (thickness≧1-10 nm) or Ir (thickness≧5-20 nm), that provides a structure for a catalyst layer 17. Use of a second sub-layer 15B also allows growth of SWCNTs, MWCNTs and CNFs on a (coated) substrate that need not be compatible with the catalyst. An example is use of highly oriented pyrolytic graphite (HOPG) or amorphous carbon on the substrate. For convenient reference, the optional first layer 15 will be referred to as the "first layer," whether the structure is single-layer or multi-layer, except where details of this layer are important.

One or more ion sources 18 provide ion beams that are directed at a metal sputtering source 19 that produces particles of a selected metal, such as Fe, Co, Ni, Mo or Pd that forms a catalyst layer 17, having a preferred thickness of 0.1-20 nm, on the first layer 15. Two or more metals can be deposited simultaneously or sequentially as part of the first layer 15 and/or the second layer 17, using one or more sputtering sources.

If the support structure 13/15/17 is to promote a patterned array of carbon nanotubes, a mask 20 is positioned between the sputtering source 19 and the first layer 15 to prevent the catalyst layer 17 from forming at selected locations. The mask 20 creates a "shadow" on the first layer 15, preventing the catalyst layer 17 from forming and producing a "void" 17' where the catalyst material would otherwise appear.

The mask 20 can be a shadow mask that is positioned over the substrate 13 (or over the substrate 13 plus first layer 15) by the adherence of molecules to the substrate surface, with selected regions of the adherence molecules removed, as occurs with photolithography and e-beam lithography; or by the addition of other self-assembling molecules, such as proteins or lipid layers or small metal particles held in place within a biological or chemical molecule and positioned onto a surface in a two-dimensional or three-dimensional array.

A second layer 17 thicker than 0.1-20 nm may be used here. The active catalyst may include a co-catalyst, such as a small amount of Mo in addition to the Fe, Co and/or Ni, or a mixture thereof, especially in the absence of an Al first layer 15, in order to promote a higher density of the SWCNTs in the array. The second layer 17 catalyzes the required chemical reaction(s) and may be deposited using ion beam sputtering from a source 19 located adjacent to the substrate 13. The substrate may be Si, porous Si, amorphous carbon, highly oriented pyrolytic graphite (HOPG), an AFM cantilever, fused quartz, zeolite, mica, selected ceramics, selected polymers, selected metals, natural minerals or any similar material. Provision of the first layer 15 enhances electrical conductivity associated with the carbon nanotube and also helps prevent lift-off of the catalyst in the second layer 17 from the substrate 13.

In one approach, a pattern including one or more catalysts in the second layer 17 is deposited in one chamber, and the system 11 is moved to a second chamber for growth of the carbon nanotubes. In another approach, catalyst deposit and patterned carbon nanotube growth occur in the same chamber.

A feed gas source 21 within the chamber 12 (e.g., a quartz tube) provides a heated gas, such as $CH_4$ at a temperature in the range T=800-1100° C., at a selected gas flow rate, such as 1000 sccm. A relatively inert carrier gas, such as Ar or Xe or Kr or $N_2$, is optionally used to transport the heated gas across the coated support structure 13/15/17, and the coated support structure successively strips the hydrogen atoms from the heated gas to ultimately produce C particles (bare C atoms and C molecules, etc.) that are received at, and accumulate on, a portion of the coated substrate and contribute to the growth of SWCNTs, according to the catalyst pattern deposited on the substrate. If the heated gas temperature adjacent to the coated support structure 13/15/17 drops substantially below T=800° C., for example, to T≈750° C., the growth of SWCNTs will stop. The gas $CH_4$ requires use of a relatively high temperature (T=800-1100° C.) in order to promote H atom stripping to produce substantially "bare" C atoms and molecules. The chamber temperature is then dropped to or below T≈300° C. before the coated substrate and SWNT growth array are exposed to air.

A shutter or similar mechanism 23 and aperture 24 are positioned between the sputtering source 19 and the feed gas source 21. The shutter 23 is opened and the mask 20 is positioned when the sputtering source 19 is to be used to deposit a first layer 15 or second layer 17 of material on the substrate 13 for purposes of subsequent growth of carbon nanotubes. When this deposit has ended and the feed gas is to be admitted into the chamber 12, the shutter 23 is closed, and the guns 18 and mask 20 are removed or hidden, to protect the sputtering source and mask surfaces from deposit of carbon thereon.

Provision of a first layer 15 allows deposit of a second layer that may otherwise be chemically inconsistent with, or be poisoned by, the underlying substrate or first sub-layer. Provision of the first layer, or of a sequence of sub-layers for the first layer, can also modify the electrical conductivity properties of the finished carbon nanotube array.

If the first layer 15 is omitted, the second layer thickness is no more than about 1 nm and the substrate surface is free of scratches and similar imperfections, no SWCNTs will form on the substrate coated only with the second layer 17. If the substrate 13 has some scratches or imperfections in a given region, a few isolated SWCNTs may grow there, even if the first layer 15 is absent. Adding the first coating layer 15, with a first layer thickness of at least 0.1 nm of Ir or of at least 0.1 nm of Al or a mixture thereof to the substrate 13, increases the density and the uniformity of growth of the SWCNTs thereon. Addition of a small amount of Mo (≈0.2 nm) to the second layer 17 as a co-catalyst will increase the density of SWCNTs, where the first layer includes Ir, and has no noticeable effect on density, where the first layer contains only Al. The density of SWCNTs can be controlled and ranges from isolated SWCNTs, to a discrete uniform array, to discrete thick ropes, to a dense matte of SWCNT ropes.

The pattern of SWCNTs thus grown is determined by the pattern of the catalyst(s) deposited on the substrate coated with the first layer. The catalyst(s) can be deposited using ion sputtering from an Al or Ir source or can be deposited using arc discharge of a source, laser ablation of a source, chemical vapor deposition (CVD) from a suitable source, or a suitable metal evaporation method. The catalyst can be patterned using a mask with suitably detailed apertures that is pressed against the substrate 13, to provide a first layer pattern, and/or against the first layer 15, to provide a second layer pattern, before the next layer is formed. The mask pattern may be a regular or irregular array of polygonal or curvilinear apertures.

The diameter of SWCNTs varies from 0.9 to 2.7 nm (more generally, from 0.5 to 5 nm), and most CNTs have a diameter of about 1.3 nm. In a growth of one array of 48 SWCNTs, the diameter distribution was found to be about 10 percent at 0.9 nm, 44 percent at 1.3 nm, 29 percent at 1.8 nm, 10 percent at 2.2 nm and 6 percent at 2.7 nm. The length of an SWNT is difficult to determine, because most SWNTs do not have sufficient strength to support a substantial, vertically oriented tower (perpendicular to the local plane of the substrate).

Figure 2:
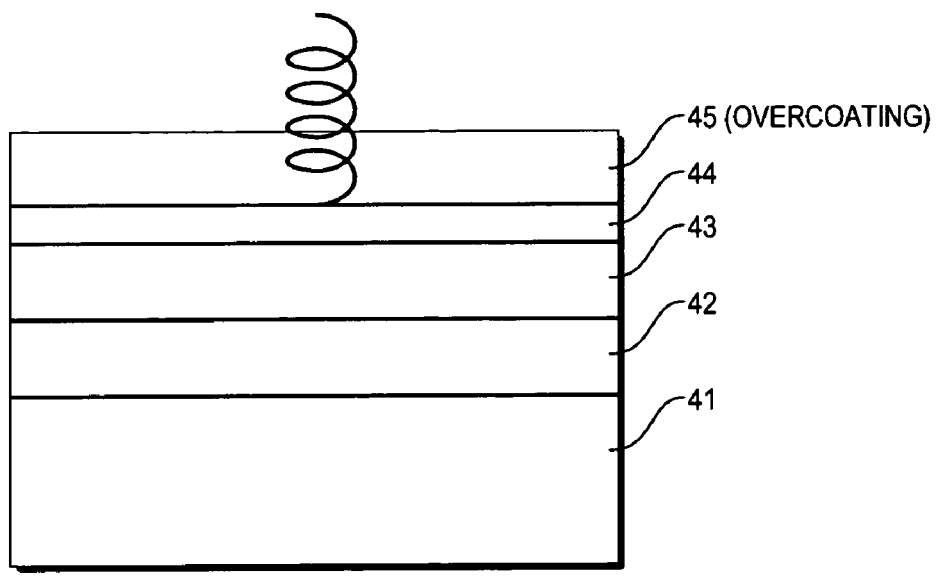
FIG. 2 schematically illustrates a four-layer structure, used to grow coated SWCNTs.

FIG. 2 schematically illustrates a five-layer support structure 40 that can also be used to grow SWCNTs. The structure 40 includes a substrate 41, a bottom layer 42 of Al (thickness≧5 nm), a second layer 43 of Fe or Co or Ni (thickness≧10 nm), a third layer 44 of Mo (thickness≧0.2 nm) and a fourth layer 45 of Al (thickness≧5 nm). Where a SWCNT is grown from the support structure 40, a portion or all of the carbon nanotube is often coated with Al. This indicates that, by providing an overcoating for a more standard four-layer structure (41/42/43/44) and choosing the overcoating material to be compatible with the growth process, coated carbon nanotubes can be grown. Overcoating materials that appear to be compatible with carbon include Al, Ga, In, Tl, Au, Ag, Zn and/or Cd.

Figure 3:
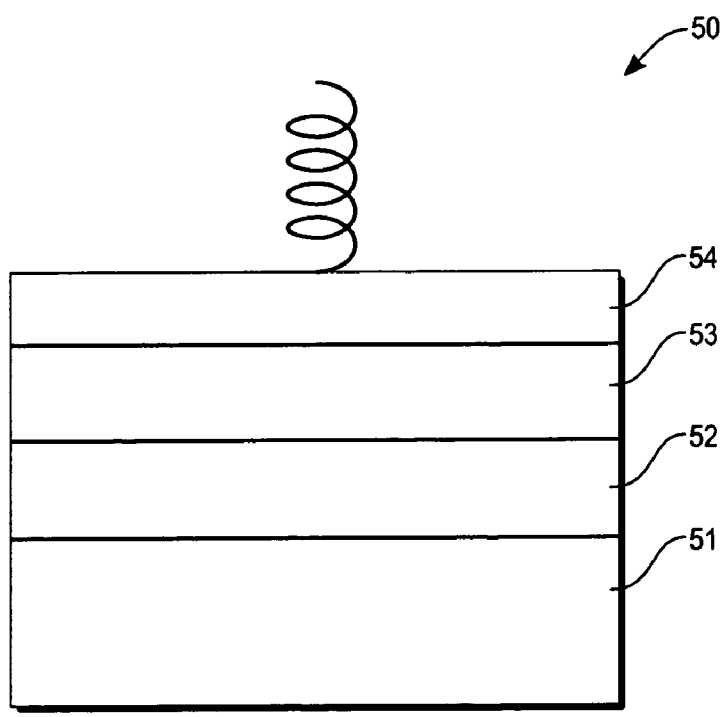
FIG. 3 schematically illustrates a structure having one, two or three layers, used to grow CNTs.

FIG. 3 schematically illustrates a structure 50 for growing carbon nanotubes, having a substrate 51, a first layer 52 of Pt, Pd, Cr, Mo, Ti and/or W or a material with similar structure, a second layer of Al or Ir and a third layer 53 of Fe, Co or Ni (thickness 0.1-20 nm). Where the structure 51 has the composition Pt/Al/Fe, the measured resistance of a CNF array on this structure is as low as 30 Ohms. Provision of a metal under-layer, such as Pt, Pd, Cr, Mo, Ti and/or W, dramatically lowers the electrical resistance associated with a CNF grown on such a structure. Where a corresponding structure is provided having one layer 52 or two layers, 52 and 53, each of thickness≧10 nm, on a substrate 51, as shown schematically in FIG. 3, the measured electrical resistance is much higher. Table 1 sets forth some multi-layer structures, each layer having a thickness 10 nm, and the estimated electrical resistances across a 5 mm distance of the CNF array.

TABLE 1

Electrical Resistance Associated With An CNF Structure

| Underlying Structure | Resistance (Ohms) |
|---|---|
| Pt/Al/Fe | 30 |
| Pt/Fe | 50 |
| Ti/Fe | 500 |
| Al/Fe | 1,000 |
| Fe | 10,000 |

Table 1 illustrates the dramatic reduction in electrical resistance that results from provision of an underlayer of a metal or alloy, such as Pt, Pd, Cr, Mo, Ti and/or W, as part of the growth structure for a CNF array (with similar results being obtained for SWCNTs and MWCNTs).

The system 11 in FIG. 1 can also be used to generate and control the growth of a patterned array of SWCNTs and MWCNTs. For MWCNTs and CNFs, presence of a metal underlayer 15 is not required, but may be included. The substrate 13 located in the chamber 14 is optionally coated with a first layer 15 of a selected first metal, preferably Al and/or Ir, having a thickness of at least 5-20 nm. The substrate 13 and optional first layer 15 are coated with a second layer 17 of a selected catalyst, such as Fe, Co and/or Ni, having a thickness of 0.1-20 nm in a desired pattern. A thicker second layer 17 may be used here. Optionally, the active catalyst includes a co-catalyst, such as a small amount of Mo in addition to the Fe, Co and/or Ni. The first layer 15, if present, may be deposited using ion beam sputtering from a first layer source 39 located adjacent to the substrate 13, or using arc discharge, laser ablation, CVD or evaporation. The catalyst(s) in the third layer 17 is preferably provided using ion beam sputtering, arc discharge or laser ablation with a suitable catalyst source and a suitably apertured mask.

A source 21 within the chamber 14 in FIG. 1 provides a heated gas, preferably $C_2H_n$ with n=2 or 4 at a temperature in the range T=650-900° C. The heated gas moves across the coated substrate 13/15/17, which successively strips the hydrogen atoms from the heated gas to ultimately produce C particles (C atoms, C═C molecules, etc.) that are received at, and accumulate on, a portion of the coated substrate and contribute to the patterned growth of MWCNTs. If the heated gas temperature drops substantially below T=650° C., for example, to T≈600° C., the growth of MWCNTs will stop. Use of the gas $C_2H_4$ allows use of a somewhat lower temperature (T=650-900° C.) in order to promote H atom stripping to produce C particles.

A mask in the form of a 400 mesh grid can be positioned on the coated substrate 13/15/17, and MWCNTs or SWCNTs can be grown (only) in the exposed regions (50 μm×50 μm with 10 μm grid widths, in one experiment) not covered by the grid, with sharp transitions between the exposed and masked regions, as shown in photomicrographs in FIGS. 9A-9C. Alternatively, the mask may be formed using electron beam lithography, which allows formation of sharply defined apertures on a suitable substrate, with diameters as low as 20 nm, with an increase in available pattern detail. It is estimated that as many as $4 \times 10^6$ SWCNTs or MWCNTs will grow in a 50 μm×50 μm growth region, using hexagonal close packing and assuming a diameter of 20 nm, and that 1-4 SWCNTs or MWCNTs will grow in a 20 nm×20 nm growth region.

Figure 4:
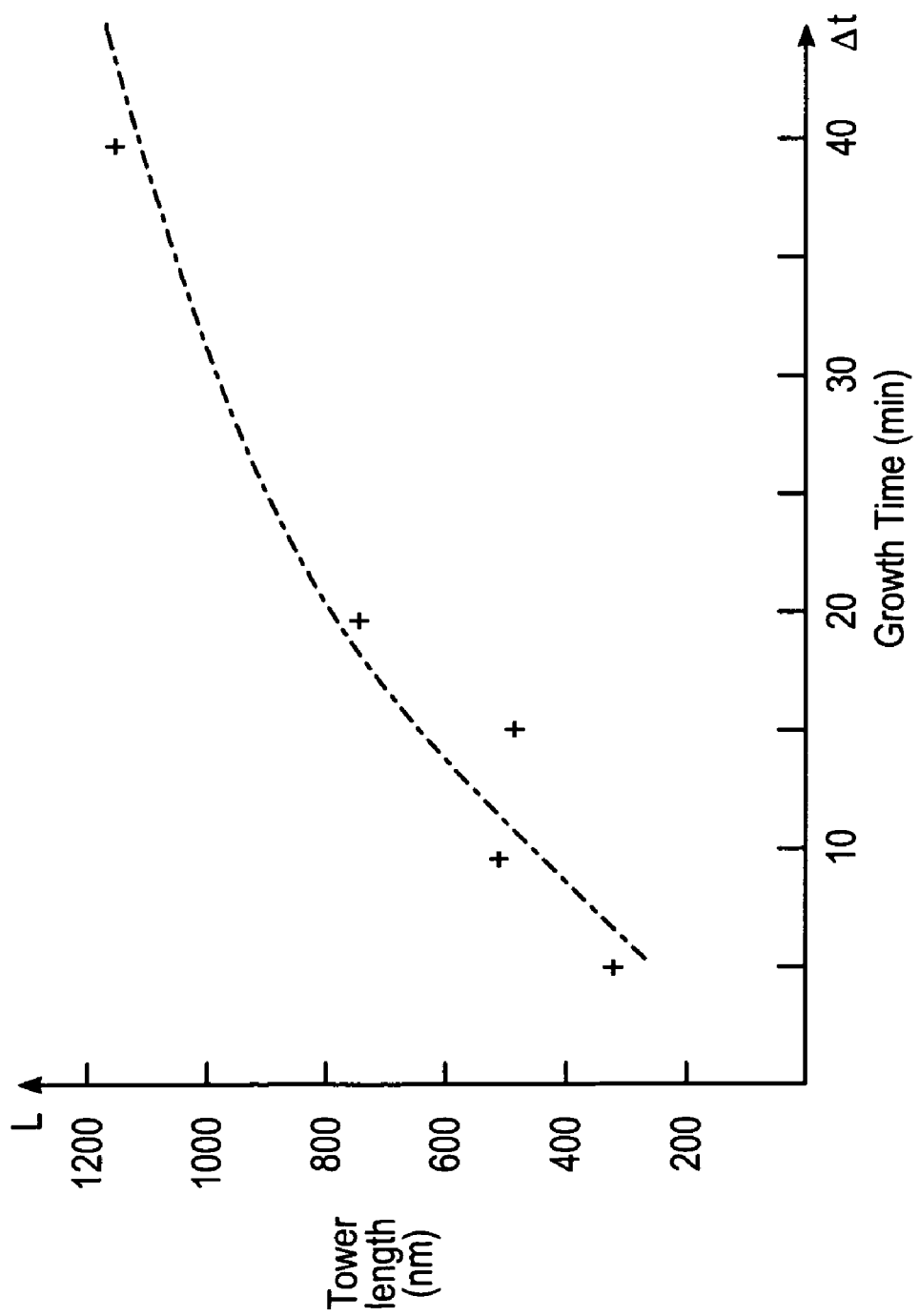
FIG. 4 graphically illustrates growth in length with time of a CNT.
Figure 5A:
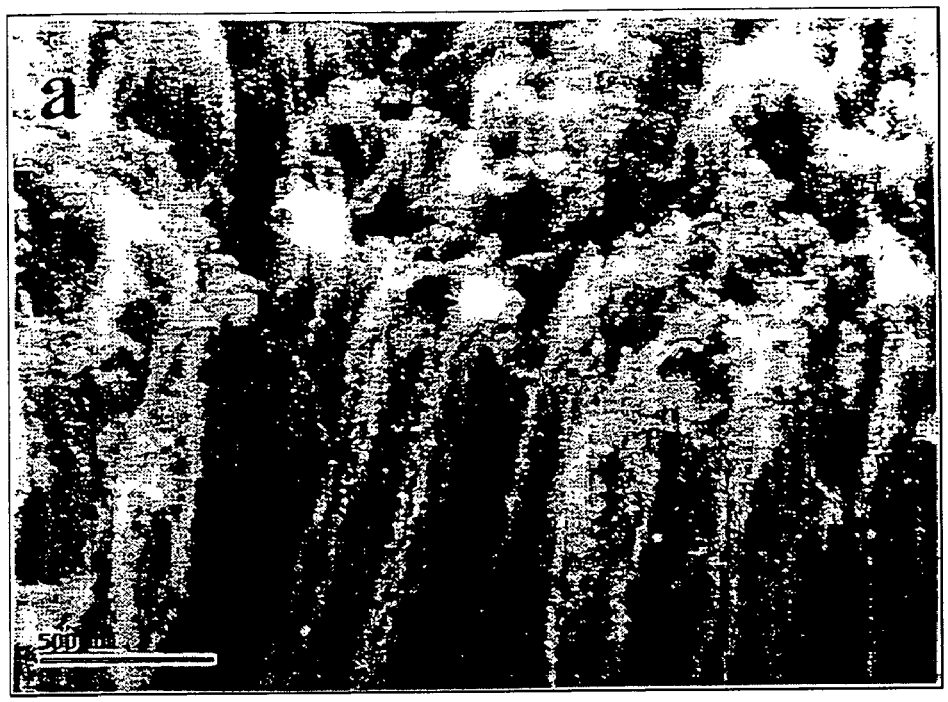
FIGS. 5A-5D are photomicrographs illustrating the effects of use of different capacitive power levels on growth of CNTs and CNFs.
Figure 5B:
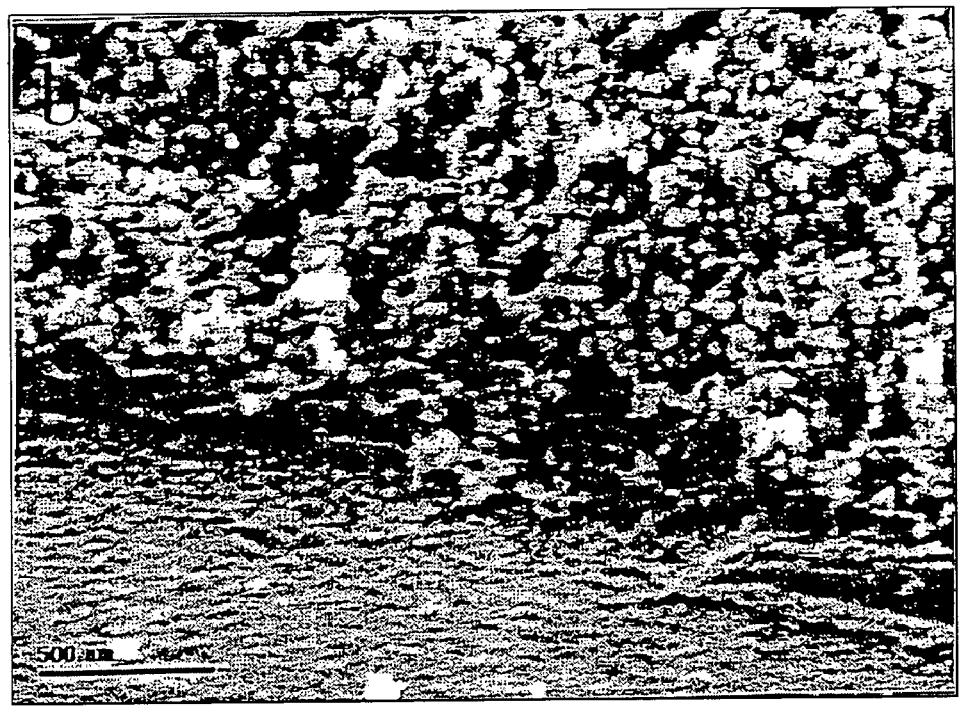
Figure 5C:
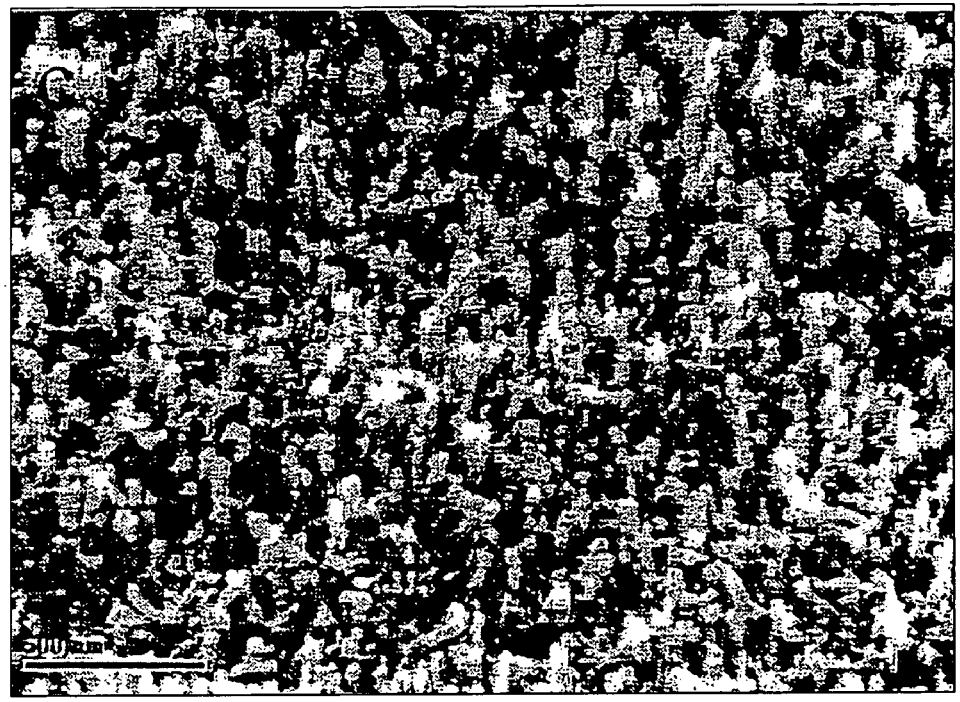
Figure 5D:

An MWCNT or CNF may be a substantially coaxial assembly of CNTs with a diameter depending upon the number of CNT layers (e.g., 2-50) that contribute to the MWCNT (or CNF). A MWCNT (or CNF) with a sufficient number of layers is self-supporting and can provide a CNT tower with a height that can be seen by an un-aided eye (e.g., 0.1-1 mm). FIG. 4 graphically illustrates some measured lengths of different CNTs, as a function of cumulative time of growth. Not all CNTs grow at the same rate, but FIG. 4 indicates that the CNT length increases approximately as $t^\alpha$ with $\alpha<1$ (characteristic of a diffusion process) over relatively long time periods. An Ni catalyst appears to provide more uniform growth of an MWCNT than does an Fe catalyst.

A carbon-based nanofiber (CNF) has a substantially non-hollow core of graphitic carbon and is configured in one mode as a sequence of similar truncated cones of graphitic C that fit together in a substantially coaxial pattern resembling an MWCNT. Typically, a CNF has a cone apex angle of 10°-90°, has a diameter of 15-200 nm and may reach a maximum height of tens to hundreds of microns or more. The feed gas used to generate an CNF is typically $CH_4$, $C_2H_4$ or $C_2H_2$ in an appropriate temperature range.

Plasma-enhanced CVD (PECVD) or normal CVD has been used to grow CNTs on a two-layer, three-layer or four-layer structure, using various materials for the support layers, and electrical resistances have been measured for these structures. A support structure of Al/Fe/Mo, deposited using sputtering, allows CVD growth of SWCNTs having electrical resistance of about 22 kilo-ohms. Table 2 sets forth estimated resistances for MWCNTs and CNFs grown using PECVD to provide the support structure. MWCNTs and CNFs can be grown using a plasma with or without using the Al/Ir first layer shown in FIG. 1, but SWCNTs grown using a plasma may require this first layer.

PECVD can also be used to form SWCNTs and MWCNTs with a modest number (2-5) of CNT walls. SWCNT growth is normally promoted by using a thinner catalyst layer and higher growth temperatures than the catalyst thicknesses and temperatures used for growth of CNFs and MWCNTs.

In any plasma discharge, change of the temperature, the pressure, the flow rate(s), the feed gas(es) and feed gas ratios, the method of initiating the plasma, sample pre-treatment, electrical bias, capacitive power, inductive power and/or catalyst will affect the type and quality of carbon nanotubes grown.

TABLE 2

Resistance Associated With PECVD-Grown MWCNTs and CNFs

| Support Structure | Resistance (Ohms) |
|---|---|
| Cr/Fe (MWCNT) | 345 |
| Cr/Al/Fe (CNF) | 460 |
| Pt/Al/Fe (MWCNT) | 70 |
| Ti/Fe (MWCNT) | 300 |
| W/Fe (MWCNT) | 22,000 |
| W/Fe (CNF) | 80 |

TABLE 2-continued

Resistance Associated With PECVD-Grown MWCNTs and CNFs

| Support Structure | Resistance (Ohms) |
|---|---|
| W/Al/Fe (MWCNT) | 50 |
| Ni (CNF) | ≧2,000 |
| Fe (CNF) | 5,000 |

FIGS. 5A, 5B, 5C and 5D illustrate a transition in the carbon nanotube structure for the respective capacitive power values of 20 W, 30 W, 40 W and 50 W. At 50 W, the carbon nanotubes appear to be substantially all CNFs. Changing the inductive power level in such a process has little or no visible effect on the relative amounts of CNTs and CNFs grown in a plasma reactor environment.

From the results produced by "scraping" an array of MWCNTs from the coated substrate, it appears that the MWCNTs are strongly attached to the coated substrate. This attachment may be Ohmic. When the coated substrate is scraped, the MWCNT arrays appear to come off as flakes, which is consistent with a base growth pattern, as opposed to a tip growth pattern.

Figure 6A:
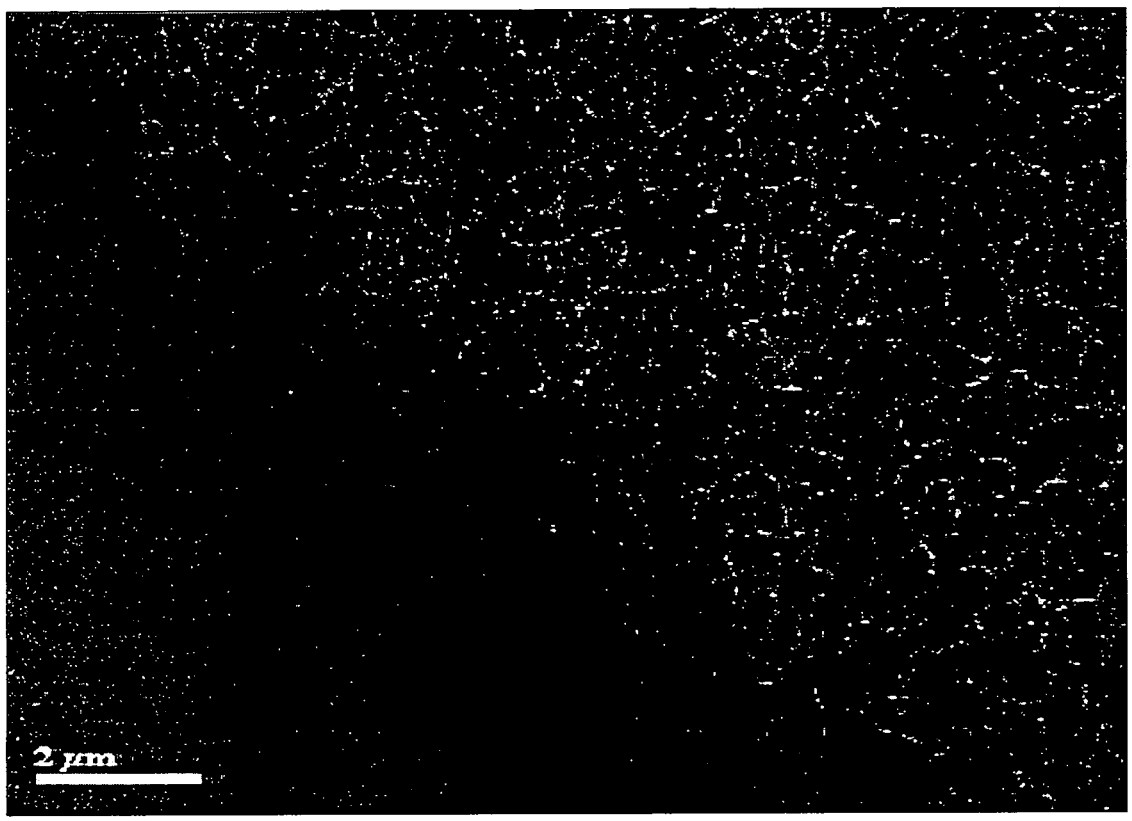
FIGS. 6A-6C are photomicrographs showing well defined carbon nanotube growth regions adjacent to mask edges, for an SWCNT, and MWCNT and a CNF, respectively.
Figure 6B:
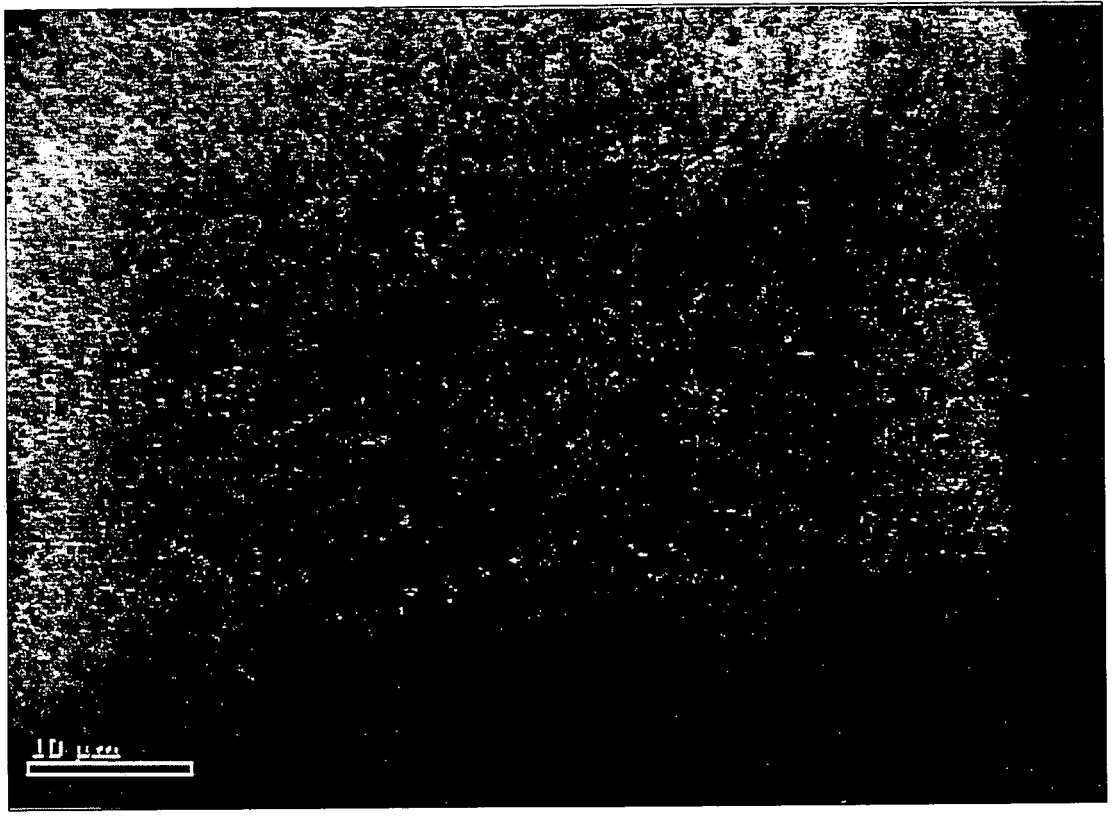
Figure 6C:
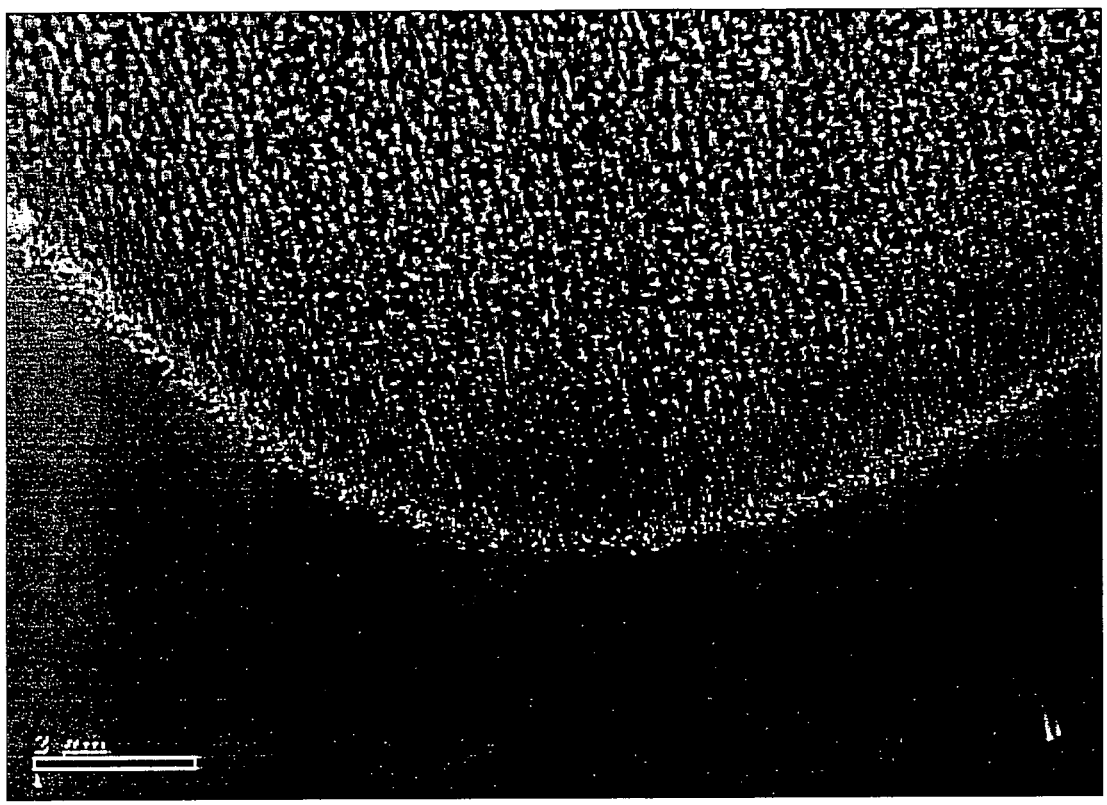

FIGS. 6A, 6B and 6C are photomicrographs showing well defined carbon nanotube growth regions adjacent to mask edges, for a SWCNT, a MWCNT and a CNF, respectively. These images demonstrate that the (exposed) growth regions are more or less uniformly filled with carbon nanotubes and that, at a line between a growth region and a masked region, the concentration of carbon nanotubes changes abruptly from substantially zero in the masked region to a non-zero, approximately uniform value in the growth region.

Figure 7:
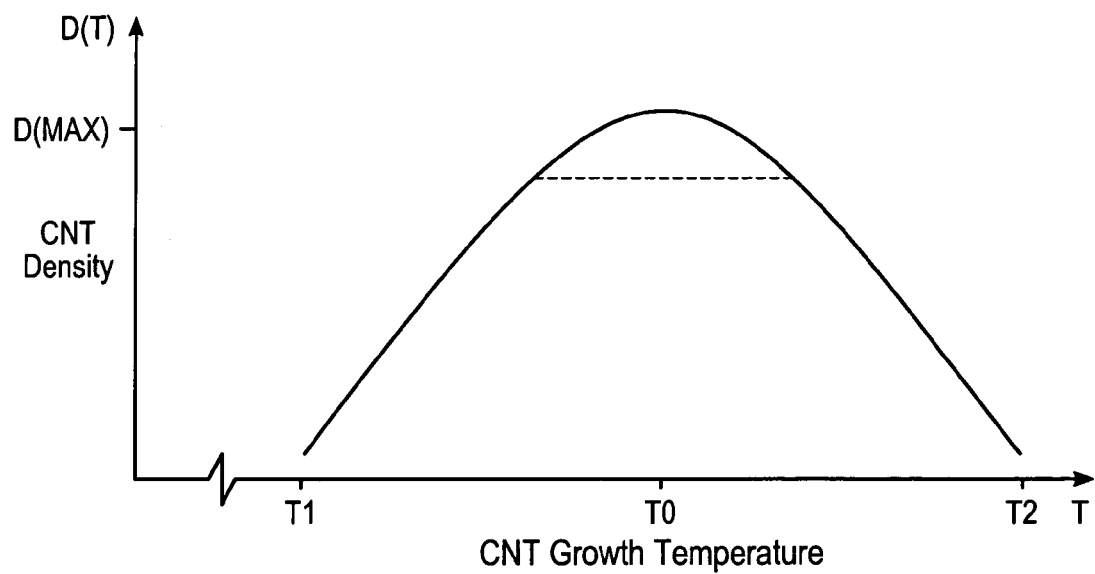
FIG. 7 is a representative curves of CNT density versus CNT growth temperature, manifesting a maximum density at an intermediate temperature.

FIG. 7 is an approximate graphical illustration of average CNT growth density in a suitably prepared CNT growth region, as a function of growth temperature T. The growth density $D(T)$ rises from a very small value (substantially 0) at a first temperature limit, $T=T1$ to a maximum growth density value $D(max)$ at an intermediate temperature, $T=T0$, and decreases to a very small value (substantially 0) as the temperature increases further (about $T0$) to a second temperature limit, $T=T2$. Preferably, one operates in the temperature range $T1 \leq T \leq T0$, if only density control is of concern.

The density $D$ of CNT growth illustrated in FIG. 7, expressed as a function of growth temperature T, can be approximated by a relation such as $$D(T;app) = a - b \cdot |T^q - T0^q|^p, \quad (1)$$

where a, b, q and p are selected positive parameters that depend upon the particular growth process being used. As the exponent p increase, the curve in FIG. 7 becomes increasingly sharply curved or peaked near $T=T0$. As the exponent difference $|q-1|$ increases from 0, the curve in FIG. 7 becomes increasingly non-symmetric about $T=T0$. The approximation in Eq. (1) can be used to demonstrate some qualitative features of density difference over a region.

A density curve according to Eq. (1) will behave approximately as shown in FIG. 7, for a selected temperature range, such as $T0-\delta T \leq T \leq T0+\delta T$. The growth temperature T may not be precisely the same at all points in a region R and may have a small range, such as $T1 < T_L \leq T \leq T_L + \Delta T = T_U < T2$, with $T0 - \delta T(max) < T_L < T_U \leq T0$. Where the density function $D(T)$ has a temperature slope $(dD/dT)$ that decreases monotonically as T increases from $T1$ to $T0$, the maximum density-minimum density difference will decrease monotonically as $T_L$ increases, for fixed temperature difference $\Delta T$. This is also confirmed for the approximation $D(T;app)$ in Eq. (1). For a fixed temperature uncertainty $\Delta T$, one has a maximum density uncertainty $\Delta D(max)$ at or near the lowest temperature in the range, $T=T1$, and the density uncertainty decreases substantially monotonically as $T_L$ increases toward $T0-\Delta T$.

If the desired CNT density range is to be relatively small, the growth temperature T in the region should be more tightly controlled so that the growth temperature difference $\Delta T$ can be reduced. One can use a selected temperature range (e.g., $T_L \leq T \leq T_U$) and lowest value $(T_L)$ to vary the relative density of CNTs grown in a region, and one can thereby control the density difference or density uncertainty in this region by controlling the temperature difference, $\Delta T = T_U - T_L$.

A curve of non-amorphous CNT tower height versus temperature is qualitatively similar to the curve of CNT density versus temperature for $T1 \leq T \leq T0$ shown in FIG. 7, although a temperature for maximum tower height need not coincide with the temperature $T0$ for maximum density shown in FIG. 7.

In an earlier-filed patent application (U.S. Ser. No. 10/099, 247), Delzeit et al observed that growth of single wall CNTs (SWCNTs), multi-wall CNTs (MWCNTs) and carbon nanofibers (CNFs) may proceed under the following environmental conditions:

SWCNTs: T=800-1100° C.; feed gas=$CH_4$;
MWCNTs: T=650-900° C.; feed gas=$C_2H_4$ of $C_2H_2$;
CNFs: T=400-900° C.; feed gas=$C_2H_4$ or $C_2H_2$.

Other feed gases containing C may also be suitable for such growth. Delzeit et al also observed that deposit of a catalyst layer of Fe, Co, Ni and/or Mo, of thickness 0.1-20 nm, on a substrate will promote the growth of a CNT array, especially in the absence of a supplemental layer of Al or Ir. Where the supplemental layer is too thin or is absent and no catalyst layer is present, few or no CNTs are likely to grow on the substrate, even with the right environmental conditions. It is likely that, as a lower limit for temperature is approached from above (e.g. T decreasing toward 800° C. for SWCNTs), the density of CNTs grown in an array will drop precipitously toward 0 as the lower limit is approached.

Delzeit et al also observed that use of the following or a two-layer structure (e.g., Pt/Fe) or a three-layer structure (e.g., Pt/Al/Fe) on a substrate, used to grow CNF arrays, will provide CNF arrays with electrical resistances of about 30 Ohms and about 50 Ohms, respectively, whereas absence of the Pt layer will produce arrays with electrical resistances of 500-10,000 Ohms. The Wiedemann-Franz law in physics indicates that the ratio of thermal conductivity to electrical conductivity is approximately a constant (within a factor of about 3) across a variety of materials so that high thermal and high electrical conductivity tend to occur in the same material.

Figure 8:
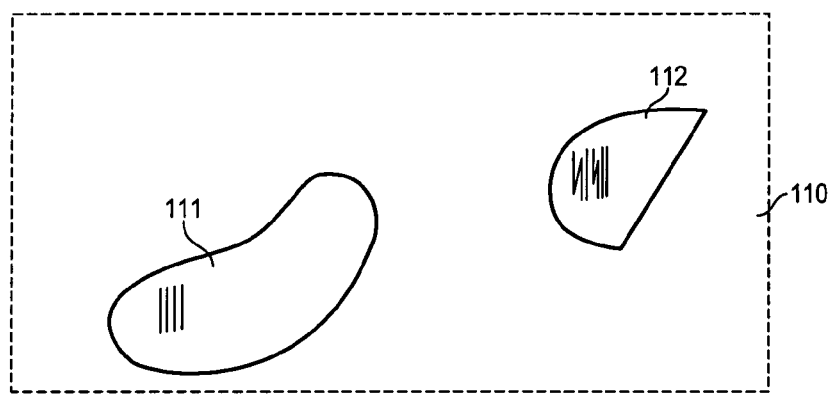
FIG. 8 schematically illustrates application of the invention to control of temperature or voltage of an electronic device.

FIG. 8 illustrates an application of the invention to density control for an electronic device or substrate 110, where region 111 requires that the local CNT growth temperature be no more than about $T(111)$ (e.g., with $T_1 \approx T(111) = 500°$ C.), with associated CNT density of $D(T_1)$ and a spaced apart region 112 requires a CNT array with a larger CNT density $D(T_2)$, corresponding to a higher temperature $T_2 \approx T(112)$ (e.g., $T(112) = 700°$ C.) that is substantially greater than $T_1$. CNT growth at a first temperature $T_1 \leq T(111)$ proceeds as indicated in the preceding so that the entire substrate has (at least) a first CNT density of approximately $D(T_1)$, corresponding to the temperature $T=T_1$. Simultaneously or subsequently, the region 112 is preferentially heated to a higher second or augmented temperature, $T=T_2$, using a local resistive heater, a focused laser beam, a focused particle beam or a similar localizable heating source. In the region 112, the CNT density is approximately $D(T_2)$, corresponding to the augmented temperature $T_2$, as discussed in the preceding. This approach can be used to provide a CNT density $D(T_n)$ (n=1, ..., N; N≧2) in each of N-1 spaced apart regions (n=2, ..., N), using localizable heating sources for each region where the CNT growth temperature in each of these N-1 regions is to be substantially larger than the base growth temperature ($T_1$) used for the remainder of the substrate 110.

Proceeding in a similar manner, CNT average tower height $H(T'_m)$ can also be varied in each of M-1 spaced apart regions (m=2, ..., M; M≧2), relative to a first region, m=1, using localizable heating sources in each of M-1 regions (m=2, ..., M) where the CNT growth temperature in each of these M-1 regions is to be substantially greater than the base growth temperature $T'_1$ used for the remainder of the substrate 110.

The approach illustrated in FIG. 8 can be applied to vary the CNT density in different regions of a substrate: (1) to control or vary thermal transport from different regions of the substrate (or device on a substrate); (2) to control or vary transport of electrically charged particles (or to vary electrical resistance) from different regions of the substrate and (3) to vary or control a material property that is analogous to thermal transport or electrical transport from different regions of a substrate. Average (non-amorphous) CNT tower height in different regions of the substrate can also be controlled or varied, according to the desired application.

Figure 9:
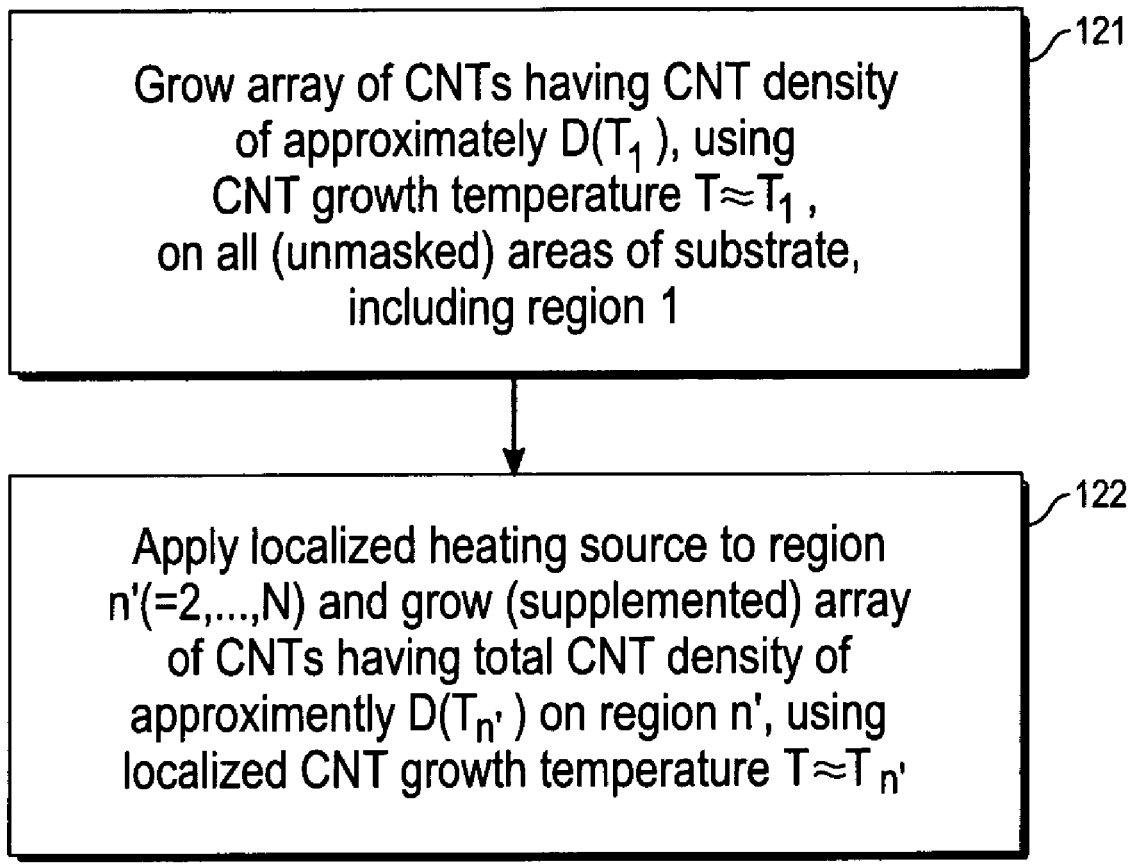
FIGS. 9 and 10 are flow charts of procedures for practicing the invention.

FIG. 9 is a flow chart illustrating a procedure for providing a CNT density $D(T_n)$ in each of N spaced apart regions, numbered n=1, ..., N (N≧2). In step 121, a base CNT growth temperature $T_1$ is applied to the substrate, and CNT growth proceeds as discussed in the preceding, to provide a CNT density of (at least) $D(T_1)$ on all unmasked regions of a substrate. In step 122, a localized heating source is applied to (unmasked) region number n' (n'=2, ..., N) to provide a localized CNT growth temperature $T \approx T_{n'}$ ($>T_1$), simultaneously or subsequent to application of the base temperature $T_1$, and CNT growth proceeds as discussed in the preceding, to provide a CNT density of approximately $D(T_n)$ for the region number n' (n'=1, ..., N). A first feed gas $C_{m1}H_{n1}$ can be supplied for growth of a CNT array in a first region, and a second (different) feed gas $C_{m2}H_{n2}$ can be supplied for growth, or supplemental growth, of a CNT array in a second region, wherein one or more characteristics of the first and second regions are to be different from each other.

Figure 10:
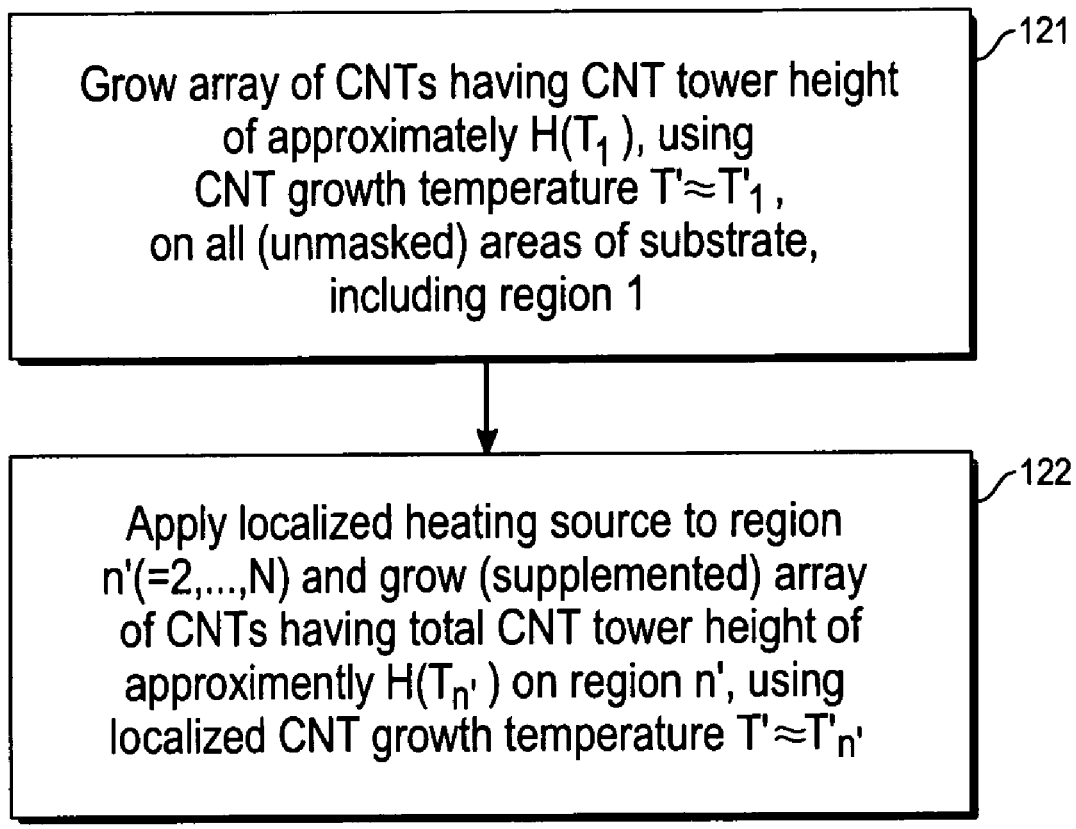

FIG. 10 is a flow chart indicating a procedure for providing a CNT average tower height $H(T'_n)$ in each of M spaced apart regions, numbered m=1, ..., M (M≧2). In step 131, a base CNT growth temperature $T'_1$ is applied to the substrate, and CNT growth proceeds as discussed in the preceding, to provide a CNT tower height of (at least) $H(T'_1)$ on all unmasked regions of a substrate. In step 132, a localized heating source is applied to (unmasked) region number n' (n'=2, ..., N) to provide a localized CNT growth temperature $T \approx T'_{n'}$ ($>T'_1$), simultaneously or subsequent to application of the base temperature $T'_1$, and CNT growth proceeds as discussed in the preceding, to provide a CNT average tower height of approximately $H(T'_n)$ for the region number m (m=1, ..., M).

The invention provides a procedure for varying the CNT density D(T) or the CNT tower height H(T) in two or more regions of a substrate on which the CNTs are grown, by varying the local temperature within each of these regions. The invention also provides a procedure for controlling the density uncertainty ΔD or tower height uncertainty ΔH within a region by choice of the lowest temperature $T_L$ and/or by control of the temperature range or difference, $T_U - T_L$, associated with CNT growth in that region.

What is claimed is:

1. A method for controlling density of an array of carbon nanotubes, referred to as "CNTs," in two or more regions of a substrate, the method comprising:
   providing a substrate, having a selected catalyst region suitable for growth of CNTs;
   providing a designation of a first range and a second range of CNT densities for a first CNT growth region and for a second CNT growth region, respectively, on the substrate, where the second CNT growth region is spaced apart from the first CNT growth region;
   heating the substrate to a first temperature $T_1$ lying in a first CNT growth temperature range;
   locally heating the second CNT growth region, but not the first CNT growth region, to a second temperature $T_2$, substantially greater than $T_1$ and lying in a second CNT growth temperature range; and
   exposing the substrate to a source of $C_mH_n$ molecules, for selected positive numbers m and n, permitting a CNT array having approximately a first average density ρ1 within the first density range to grow in the first region, and permitting a CNT array having approximately a second average density ρ2 within the second density range to grow in the second region, where ρ1 differs substantially from ρ2.

2. The method of claim 1, further comprising selecting said numbers m and n from the set of pairs (m,n)=(1,4), (2,4) and (2,2).

3. The method of claim 1, further comprising selecting at least one of said first temperature range and said second temperature range to be contained in one of the ranges 400° C.≦T≦900° C., 650° C.≦T≦900° C., and 800° C.≦T≦1100° C., and said first temperature range and said second temperature range do not substantially overlap.

4. The method of claim 1, wherein said first range of source temperatures contains no temperature greater than about 500° C.

5. The method of claim 1, further comprising controlling an uncertainty in said CNT density in said first CNT growth region by controlling at least one of: (i) a lowest temperature in said first CNT growth temperature range and (ii) a maximum temperature difference between a highest temperature and a lowest temperature in said first CNT growth temperature range.

6. The method of claim 5, further comprising controlling an uncertainty in said CNT density in said second CNT growth region by controlling at least one of: (i) a lowest temperature in said second CNT growth temperature range and (ii) a maximum temperature difference between a highest temperature and a lowest temperature in said second CNT growth temperature range.

7. A method for controlling density of an array of carbon nanotubes, referred to as "CNTs," in two or more regions of a substrate, the method comprising:
   providing a substrate, having a selected catalyst region suitable for growth of CNTs;
   providing a designation of a first range and a second range of CNT densities for a first CNT growth region and for a second CNT growth region, respectively, on the substrate, where the second CNT growth region is spaced apart from the first CNT growth region;
   locally heating the first CNT growth region to approximately a first selected temperature $T_1$;
   exposing the first CNT growth region to a source of $C_{m1}H_{n1}$ molecules, for selected positive numbers m1 and n1, having source temperatures approximately equal to the first selected temperature $T_1$, which lies in a first CNT growth temperature range, 400° C.≦T≦900° C., and permitting a CNT array of at least one of multi-wall carbon nanotubes and carbon nanofibers, having a first average density ρ1 within the first density range to grow in the first CNT growth region; and locally heating the second CNT growth region, but not the first CNT growth region, to a second selected temperature $T_2$, substantially greater than $T_1$; and exposing the second CNT growth region to a source of $C_{m2}H_{n2}$ molecules, for selected positive numbers m2 and n2, having source temperatures approximately equal to the second selected temperature $T_2$, which is greater than $T_1$ and lies in a second CNT growth temperature range, 800° C.≦T≦1100° C., and permitting a CNT array of single wall carbon nanotubes, having a second average density ρ2 within the second density range to grow in the second CNT growth region, where the pair (m1,n1) is drawn from the set of pairs consisting of (2,4) and (2,2) and the pair (m2,n2) is (1,4).

8. The method of claim 7, wherein said first range of source temperatures contains no temperature greater than about 500.

9. The method of claim 7, further comprising controlling an uncertainty in said CNT density in said first CNT growth region by controlling at least one of: (i) a lowest temperature in said first CNT growth temperature range and (ii) a maximum temperature difference between a highest temperature and a lowest temperature in said first CNT growth temperature range.

10. The method of claim 9, further comprising controlling an uncertainty in said CNT density in said second CNT growth region by controlling at least one of: (i) a lowest temperature in said second CNT growth temperature range and (ii) a maximum temperature difference between a highest temperature and a lowest temperature in said second CNT growth temperature range.

11. A method for controlling tower height of an array of carbon nanotubes, referred to as "CNTs," in two or more regions of a substrate, the method comprising:

providing a substrate, having a selected catalyst region suitable for growth of CNTs;

providing a designation of a first range and a second range of CNT tower heights for a first CNT growth region and for a second CNT growth region, respectively, on the substrate, where the second region is spaced apart from the first region;

locally heating the first CNT growth region to a first selected temperature $T_1$ lying in a first CNT growth temperature range;

exposing the first CNT growth region to a source of $C_mH_n$ molecules, for selected positive numbers m and n, having source temperatures approximately equal to a first selected temperature $T_1$ in a first CNT growth temperature range, for a selected first time interval, and permitting a CNT array having approximately a first average tower height $h_1$ within the first tower height range to grow in the first CNT growth region;

locally heating the second CNT growth region, but not the first CNT growth region, to a second selected temperature $T_2$, which differs substantially from $T_1$, lying in a second CNT growth temperature range; and exposing the second CNT growth region to the source of $C_mH_n$ molecules having source temperatures approximately equal to a selected second temperature $T_2$ in a second CNT growth temperature range, for a selected second time interval, and permitting a CNT array having an approximately a second average tower height $h_2$ within the second tower height range to grow in the second CNT growth region.

12. The method of claim 11, further comprising selecting said integers m and n from number pairs (m,n)=(1,4), (2,4) and (2,2).

13. The method of claim 11, further comprising selecting at least one of said first temperature range and said second temperature range to be contained in one of the ranges 400° C.≦T≦900° C., 650° C.≦T≦900° C., and 800° C.≦T≦1100° C., and said first temperature range and said second temperature range do not substantially overlap.

14. The method of claim 11, wherein said first range of source temperatures contains no temperature greater than about 500° C.

15. The method of claim 11, further comprising controlling an uncertainty in said first CNT tower height in said first CNT growth region by controlling at least one of: (i) a lowest temperature in said first CNT growth temperature range and (ii) a maximum temperature difference between a highest temperature and a lowest temperature in said first CNT growth temperature range.

16. The method of claim 15, further comprising controlling an uncertainty in said CNT tower height in said second CNT growth region by controlling at least one of: (i) a lowest temperature in said second CNT growth temperature range and (ii) a maximum temperature difference between a highest temperature and a lowest temperature in said second CNT growth temperature range.

17. A method for controlling tower height of an array of carbon nanotubes, referred to as "CNTs," in a selected region of a substrate, the method comprising:

providing a substrate, having a selected catalyst region suitable for growth of CNTs;

providing a designation of a first range and a second range of CNT tower heights for a first CNT growth region and for a second CNT growth region, respectively, on the substrate, where the second region is spaced apart from the first region;

locally heating the first CNT growth region to a first selected temperature $T_1$;

exposing the first CNT growth region to a source of $C_{m1}H_{n1}$ molecules, for selected positive integers m1 and n1, having source temperatures approximately equal to the first selected temperature $T_1$ lying in a first CNT growth temperature range, for a selected first time interval, and permitting a CNT array having approximately a first average first tower height $h_1$ within the first tower height range to grow in the first CNT growth region;

locally heating the second CNT growth region, but not the first CNT growth region, to a second selected temperature $T_2$, which differs substantially from T; and exposing the second substrate region to a source of $C_{m2}H_{n2}$ molecules, for selected positive numbers m2 and n2, having source temperatures approximately equal to the second selected temperature $T_2$ lying in a second CNT growth temperature range, for a selected second time interval, and permitting a CNT array having an average second tower height $h_2$ within the second tower height range, with $T_1$ substantially different from $T_2$, to grow in the second CNT growth region, where the pair (m1,n1) and the pair (m2,n2) are drawn from the set of pairs consisting of (1,4), (2,4) and (2,2).

18. The method of claim 17, further comprising selecting at least one of said first temperature range and said second temperature range to be contained in one of the ranges 400° C.≦T≦900° C., 650° C.≦T≦900° C., and 800°

C.≦T≦1100° C., and said first temperature range and said second temperature range do not substantially overlap.

19. The method of claim 17, further comprising controlling an uncertainty in said CNT tower height in said first CNT growth region by controlling at least one of: (i) a lowest temperature in said first CNT growth temperature range and (ii) a maximum temperature difference between a highest temperature and a lowest temperature in said first CNT growth temperature range.

20. The method of claim 19, further comprising controlling an uncertainty in said CNT tower height in said second CNT growth region by controlling at least one of: (i) a lowest temperature in said second CNT growth temperature range and (ii) a maximum temperature difference between a highest temperature and a lowest temperature in said second CNT growth temperature range.

* * * * *